United States Patent [19]

Shishikura

[11] Patent Number: 5,260,895

[45] Date of Patent: Nov. 9, 1993

[54] SEMICONDUCTOR MEMORY DEVICE
[75] Inventor: Nobuo Shishikura, Yokohama, Japan
[73] Assignee: Kabushiki Kaisha Toshiba, Kawasaki, Japan
[21] Appl. No.: 651,439
[22] Filed: Feb. 7, 1991
[30] Foreign Application Priority Data
  Feb. 7, 1990 [JP] Japan .................................. 2-28017
[51] Int. Cl.⁵ ...................... G11C 11/00; G11C 13/34
[52] U.S. Cl. ........................... 365/189.0; 365/189.04; 365/218; 365/230.01; 365/189.03
[58] Field of Search ..................... 365/189.01, 189.03, 365/189.04, 218, 230.01
[56] References Cited
U.S. PATENT DOCUMENTS
  4,931,997 6/1990 Mitsuishi et al. ............... 365/228
  5,053,990 10/1991 Kreifels et al. ................ 365/189.07

Primary Examiner—Eugene R. LaRoche
Assistant Examiner—Viet Q. Nguyen
Attorney, Agent, or Firm—Foley & Lardner

[57] ABSTRACT

A semiconductor memory device comprises a memory cell array formed by arranging a plurality of rewritable non-volatile memory cells in matrix form and in correspondence to address lines and bit positions so as to be connected to erase and write lines via select gate transistors; and a controller for applying a rewriting voltage to any one of each erase line and each write line according to each bit logical value of an input data or according to each bit logical value of each selected bit of an input data in order to execute data rewrite operation. Since data rewrite operation can be executed to only the memory cells belonging to an address and required to be rewritten without once erasing all the memory cells, the data rewriting speed can be increased. By another aspect, the controller applies predetermined high voltage only for memory cells selected according to bit selection, resulting in longer lifetime of the memory cells.

7 Claims, 5 Drawing Sheets

SEMICONDUCTOR MEMORY DEVICE

BACKGROUND OF THE INVENTION

The present invention relates generally to a semiconductor device, and more specifically to an electrically rewritable non-volatile memory device.

Figure 1:
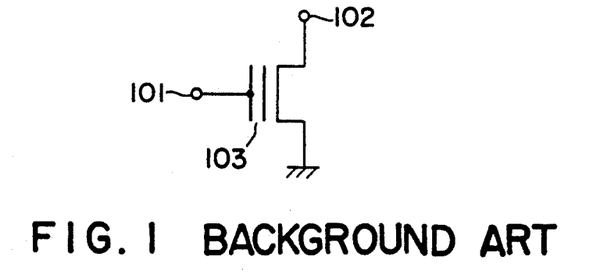
FIG. 1 is a diagram showing a prior-art memory cell used for an electrically rewritable semiconductor memory device.

FIG. 1 shows a memory cell of a conventional electrically rewritable semiconductor memory device, in which a MOS transistor having a floating gate 103 is used for a memory cell. A data rewriting operation can be executed by applying a high level voltage (referred to as a rewriting or program voltage) to one of a control gate 101 and a drain 102 thereof and a low level voltage (0 V) to the other thereof. In more detail, when a high rewriting voltage is applied to the control gate 101 and a low (0 V) voltage is applied to the drain 102, for instance, an already stored or reserved data can be erased. Thereafter, when a rewriting voltage is applied to the drain 102 and a zero voltage is applied to the control gate 101, a new data can be written.

Figure 2:
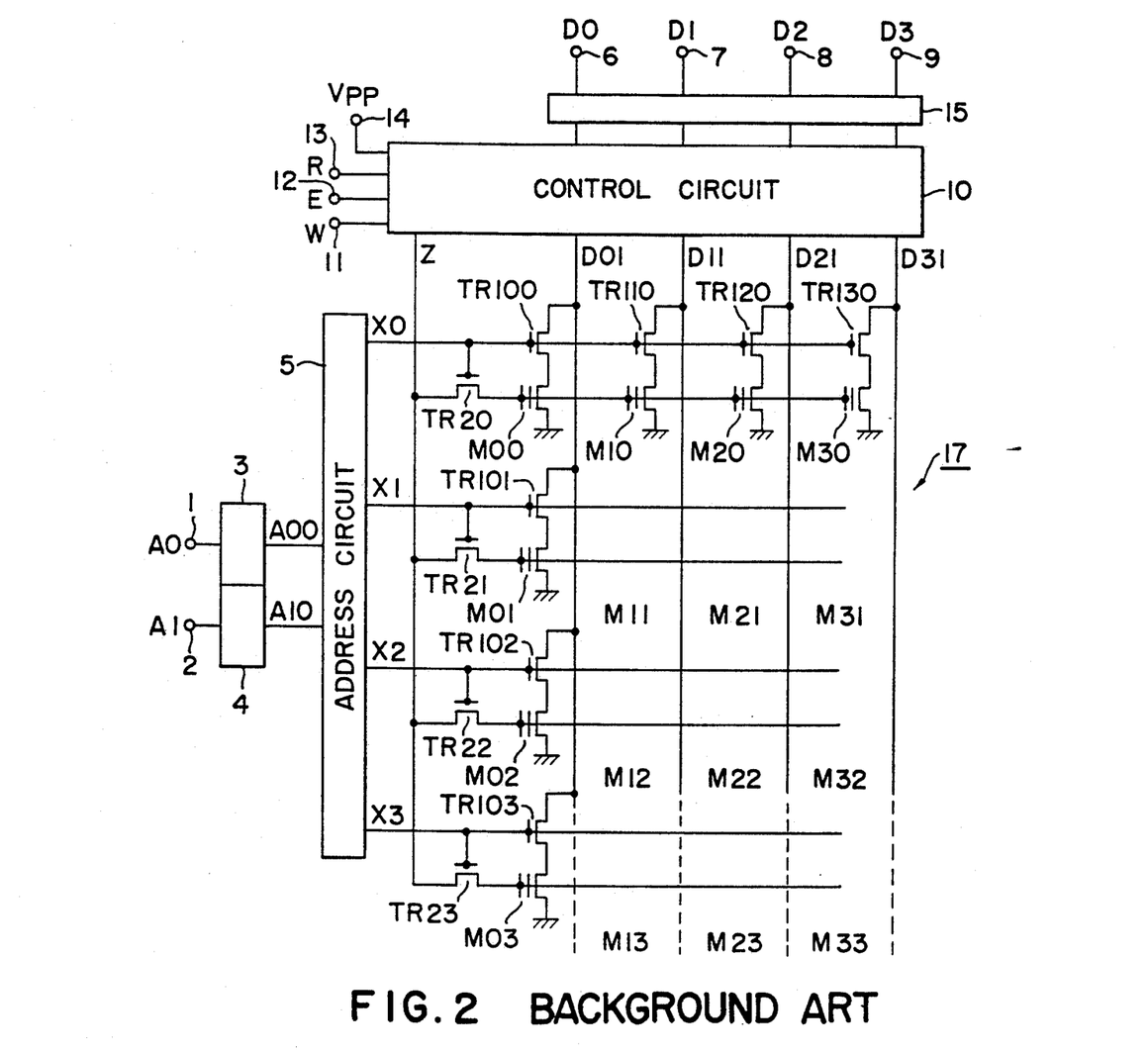
FIG. 2 is a circuit diagram showing a prior-art semiconductor memory device configuration.

FIG. 2 shows a general configuration of the conventional electrically rewritable semiconductor device composed of the memory cells as shown in FIG. 1. In the drawing, two address input circuits 3 and 4 receive two address signals A0 and A1 inputted through two address input terminals 1 and 2, respectively, and output these address signals A00 and A10 to an address decoder 5, respectively. The address decoder 5 decodes these two address signals A00 and A10 to select any one of address lines X0, X1, X2, and X3 arranged within a memory cell area 16.

A memory cell array is composed of a plurality of sets of two select transistors TR1 and TR2 (each of whose gates is connected in common to an address line) and a cell transistor M (each of whose the control gate is connected in common to the address line). In more detail, in the case of an address line X0 shown in FIG. 2, each gate of the select transistors TR100, TR110, TR120, and TR130 is connected in common to the address line X0; each source of these transistors is connected to each drain of the memory transistors M00, M10, M20 and M30; each source of these memory transistors is grounded; and each control gate of the memory transistors (e.g. M10, M10, M20 and M30) belonging to the same address is connected in common to an erase line Z of a controller 10 via a transistor TR20 turned on in response to an output of the address line X0. Further, each drain of the select transistors (e.g. TR100, TR101, TR102 and TR103) belonging to the same bit position is connected to the same data line (e.g. D01) of the controller 10.

The controller 10 executes write, erase, or read operation to each of the memory cells M00 to M33 in response to a write signals W, erase signal E or read signal R applied to control terminals 11, 12 and 13, respectively. In data write operation, a data represented by D0, D1, D2 and D3 is given to a data input/output circuit 15 through data input/output terminals 6, 7, 8 and 9, and then written in the memory cells M00 to M33 via the controller 10. In data read operation, a data is read in the reverse direction. Further, in data erase and write (i.e. rewrite) operations, a rewrite voltage $V_{pp}$ is supplied to a terminal 14 of the controller 10.

The data rewrite operation of the above-mentioned conventional memory device will be described hereinbelow. First, when the erase signal E is set to "1", a rewrite voltage $V_{pp}$ is applied to the erase line Z and a zero voltage is applied to the data lines D01 to D31. Therefore, if the address line X0 is being selected by the address decoder 5, for instance, the rewrite voltage $V_{pp}$ is applied to each control gate of the memory cells M00 to M30 belonging to the selected address line X0 via the transistor (the select gate) TR20 and the zero voltage is applied to each drain of the memory cells M00 to M30 via the transistor TR100 to TR130, so that data in the memory cells M00 to M30 are erased. Subsequently, when the write signal W is set to "1", a zero voltage is applied to the erase line z; a zero voltage is applied to the data lines D01 to D31 corresponding to "0" level bit positions of an input data D0 to D3 and a rewrite voltage $V_{pp}$ is applied to the data lines corresponding to "1" level bit positions thereof, so that a data of D0 to D3 can be written in the memory cells M00 to M30 belonging to the same address line X0 selected by the address decoder 5.

As described above, in the conventional electrically data rewritable non-volatile semiconductor memory device, a data is rewritten in such a way that after a data stored in all the memory cells belonging to an address to be rewritten have been erased, irrespective of the logical values thereof, specific logical values (e.g. "1") are written to the memory cells to be written according to the logical values of a data to be written.

In other words, the data erase operation and the data write operation are executed separately or independently. In the prior-art semiconductor memory device, additionally, since the data erasing or writing time duration is as long as several milliseconds as compared with that of other memory devices, there exists a shortcoming in that a long time is required to rewrite a data. Furthermore, since the data erase operation and the data write operation are executed separately, there exists another problem in that the data rewrite processing task is complicated and troublesome. Furthermore, since a rewrite voltage of a relatively high voltage is frequently applied to a memory cell for a long time, there arises another problem in that the memory cells are damaged, thus resulting in a short lifetime of the memory cells.

In the conventional memory devices, erase, rewrite, and read operations are performed by the unit of a bite. That is, when a data is rewritten, as described above, after a data stored in all the memory cells belonging to an address to be rewritten have been erased, irrespective of the logical values thereof, specific logical values (e.g. "1") are written to the memory cells to be written according to the logical values of a bite data to be written.

Accordingly, for memory cells which are not necessary to be read or rewritten in the selected address, read or rewritten operation is performed as well as the objective memory cells.

In such a case, conventionally, a method has been adopted such that all the data stored in all the memory cells belonging to an address line including the memory cells to be read or rewritten are once read and then temporarily stored in an external storage unit, while keeping all the data stored in memory cells other than the above memory cells. In this method, however, when a data stored in any given memory cells at an address is required to be rewritten, the data rewriting operation is complex.

Further, in the electrically rewritable semiconductor memory device, in general the memory cells are damaged whenever the data rewriting operation is executed. Therefore, since all the data stored in all the memory cells belonging to an address are rewritten, in spite of the fact that partial data stored in partial memory cells belonging to an address are required to be rewritten, there exists another problem in that memory cells at which no data rewriting operation is required are damaged, thus resulting in a short lifetime of the memory cells.

Further, in the conventional electrically rewritable non-volatile semiconductor memory device, since these memory cells are arranged in matrix fashion, whenever a data is rewritten in memory cells belonging to an address, a high voltage for data rewriting operation is inevitably applied to other vertical and horizontal lines connected to the address line to be rewritten. Therefore, there arises another problem in that electric charges stored as a memory data in other memory cells connected to the high voltage lines is reduced.

Furthermore, in the non-volatile memory cells, there exists such a tendency that whenever a stored data is read out of the memory cell, an electric charge stored as a memory data in the memory cell to be read decreases. Therefore, when a data is read out of the memory cells at an address, since the same data read operation is to be executed to all the other memory cells belonging to the same address, there exists a problem in that electric charges stored as a memory data in the memory cells at which no data are required to be read are also reduced.

SUMMARY OF THE INVENTION

Therefore, an object of the present invention is to provide a semiconductor memory device by which it is possible to conduct the erase and the write operation at the same time.

Another object of the present invention is to provide a semiconductor memory device by which it is possible to reduce the data rewriting processing task by rewriting or reading data to or from only memory cells at which data are required to be rewritten or read.

A further object of the present invention is to provide a semiconductor memory device by which it is possible to markedly reduce damage to the memory cells in data rewriting operation to increase the lifetime of the memory cells or the number of data rewritable operations thereof by reducing the frequency of high voltage applications to the memory cells when a data is rewritten.

Still further object of the present invention is to provide a semiconductor memory cell device by which it is possible to markedly increase the data storage time duration of the memory cells by preventing electric charges stored as a memory data in the memory cells from being reduced in data reading or rewriting operation.

To achieve the above-mentioned objects, the first aspect of the present invention provides a semiconductor memory device, comprising: (a) a memory cell array formed by arranging a plurality of electrically rewritable non-volatile memory cells in matrix fashion and in correspondence to address lines and bit portions, each memory cell including a memory MOS transistor with a floating gate, an erase transistor connected to a control gate of said memory transistor so as to be selectively turned on, and a write transistor having a first terminal connected in series with said memory MOS transistor so as to be selectively turned on; (b) address lines provided for each address and connected in common to gates of said erase transistors and said write transistors of said memory cells belonging to the same address; (c) erase and write lines provided for each bit; (d) each erase transistor being connected between each memory transistor and each erase line, and a second terminal of each write transistor being connected to each write line; and (e) a controller for applying a high rewriting voltage to any one of each erase line and each write line simultaneously for each bit according to each bit logical value of an input data, for execution of data rewrite operation.

In the semiconductor memory device according to the present invention, when a data is required to be rewritten in the electrically rewritable non-volatile memory cells, since either one of data erase or write operation is selected for each memory cell according to each bit logical value or each selected bit logical value of an input data and thereafter data rewriting operation is executed simultaneously to all the necessary memory cells without once erasing all the memory cells, it is possible to markedly reduce the data rewriting operation time, facilitate the data rewriting processing task and increase the lifetime of the memory cells.

Further, the second aspect of the present invention provides a semiconductor memory device, comprising: (a) a memory cell array formed by arranging a plurality of electrically rewritable non-volatile memory cells in matrix fashion and in correspondence to address lines and bit portions, each memory cell including a memory MOS transistor with a floating gate, an erase transistor connected to a control gate of said memory transistor so as to be selectively turned on, and a write transistor having a first terminal connected in series with said memory MOS transistor so as to be selectively turned on; (b) address lines provided for each address and connected in common to gates of said erase transistors and said write transistors of said memory cells belonging to the same address; (c) erase and write lines provided for each bit; (d) each erase transistor being connected between each memory transistor and each erase line, and a second terminal of each write transistor being connected to each write line; and (e) a controller for applying a predetermined high voltage to any one of each erase line and each write line according to each bit logical value of each selected bit of an input data, for execution of data read or rewrite operation.

In the semiconductor device according to the present invention, since the application of a high rewriting and reading voltage to any one of each erase line and each write line is performed only for selected bits, it is possible to further facilitate the data rewriting processing task and increase the lifetime of the memory cells.

DESCRIPTION OF THE PREFERRED EMBODIMENTS

Figure 3:
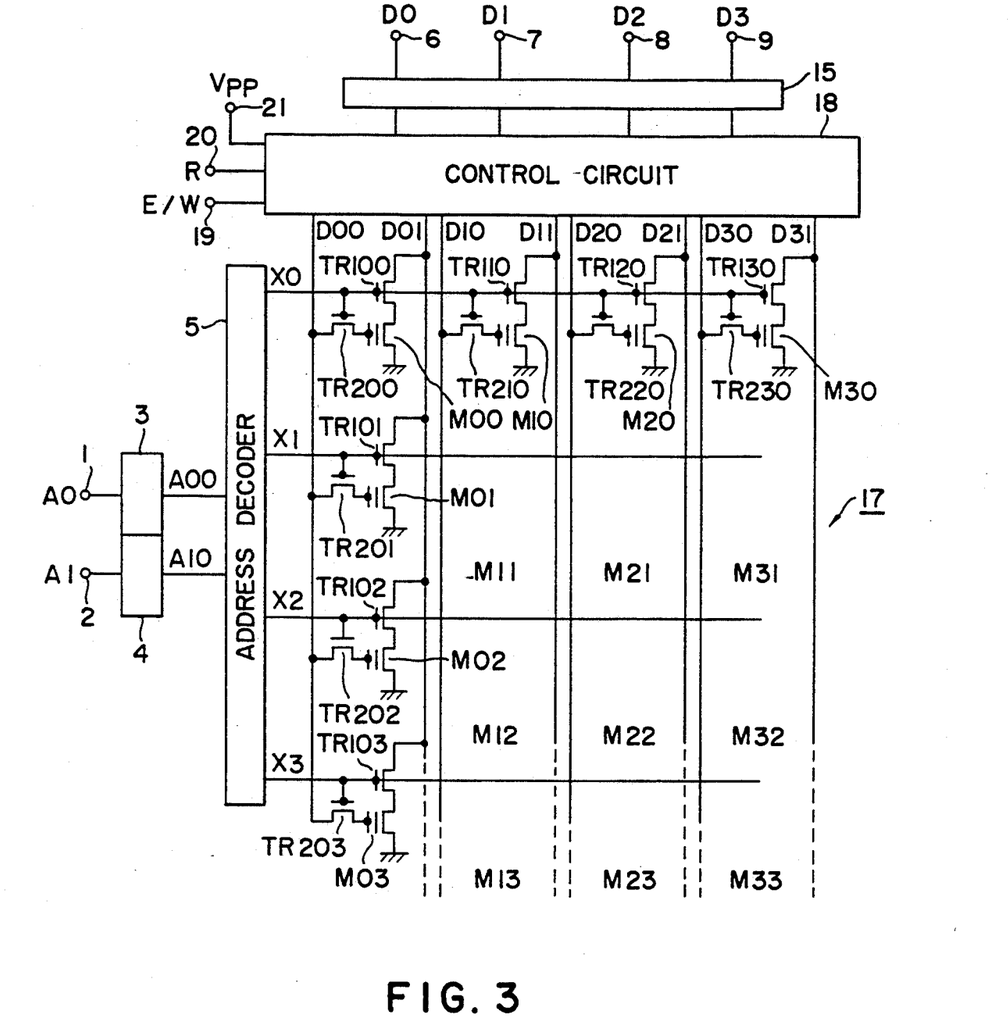
FIG. 3 is a circuit diagram showing an embodiment of the semiconductor memory device according to the present invention.

FIG. 3 shows an embodiment of the semiconductor memory device according to the present invention. In this embodiment, the semiconductor memory device is so configured that the memory capacity is 16 bits and the storage configuration is 4 words×4 bits, by way of example.

As shown in FIG. 3, the semiconductor memory device according to the present invention comprises two address input circuits 3 and 4, an address decoder 5, a memory cell region 17, a controller 18, a data input/output circuit 15, etc.

The address input circuits 3 and 4 receive signals A0 and A1 given through two input terminals 1 and 2, respectively and generate two address signals A00 and A10 to the address decoder 5. The address decoder 5 decodes these address signals A00 and A10 given through the address input circuits 3 and 4 to select any one of address lines X0, X1, X2 and X3 arranged within the memory cell region 17.

In this memory cell region 17, memory cells M00, M01, M02, M03, M10, M11, M12, M13, M20, M21, M22, M23, M30, M32, and M33 are arranged in matrix form. Each control gate of the four memory cells (e.g. M00, M10, M20, M30) arranged on the same horizontal line (e.g. x0) is connected to each of four data delete lines D00, D10, D20 and D30, respectively via each of four transistors (select gates) TR200, TR210, TR220 and TR230 (each of whose control gates is connected to the same address line x0). Further, each drain of these four memory cells (M00, M10, M20 and M30) is connected to each of four data write lines D01, D11, D21, and D31, respectively via each of four transistors (select gates) TR100, TR110, TR120 and TR130 (each of whose gates is connected to the same address line X0).

Further, each control gate of four memory cells (e.g. M00, M01, M02 and M03) arranged on the same vertical line is connected to the same data erase line (e.g. D00) via each of four transistors (select gates) TR200, TR201, TR202 and TR203, respectively, and each drain of these memory cells is connected to the same data write line (e.g. D01) via four transistors (select gates) TR100, TR101, TR102 and TR103.

The four data erase lines D00, D10, D20 and D30 and the four data write lines D01, D11, D21 and D31 are all connected to the controller 18, and each source of all the memory cells M00 to M33 is grounded.

The data input/output circuit 15 outputs a 4-bit data D0, D1, D2 and D3 given through four data input/output terminals 6, 7, 8 and 9 to the controller 18 and further outputs a 4-bit data read from the memory cell region 17 via the controller 18 and through the data input/output terminals 6, 7, 8 and 9. Buffer or latch circuits are used for the data input/output circuit 15, for instance.

The controller 18 is provided with a rewrite control terminal 19, a read control terminal 20 and a rewrite voltage input terminal 21 to execute data read operation, data erase operation and data write operation to the memory cell region 17, in response to voltage signals E/W and R applied to the control terminals 19 and 20, respectively. As has been already explained, the controller 18 is connected to each control gate of each memory cell M00 to M33 via each data erase line D00 to D30 and each transistor TR200 to TR233 and to each drain thereof via each data write line D01 to D31 and each transistor TR100 to TR133.

The controller 18 executes a data rewrite operation whenever a "1" level rewrite signal E/W is applied to the control terminal 19 thereof and a data read operation whenever a "1" level read signal R is applied to the control terminal 20 thereof.

Here, it should be noted that the memory cells belonging to the same address (e.g. M00, M10, M20 and M30) are connected to four different data erase lines D00 to D30 and four different data write lines D01 to D31, respectively. In the data rewrite operation, the controller 18 selectively applies a rewrite voltage $V_{PP}$ or a zero voltage 0 V to each data erase line and each data write line connected to each memory cell. Therefore, any one of the data erase and write operations can be selected for each memory cell. Further, in the data rewrite operation, a rewrite voltage $V_{PP}$ is supplied to the controller 18 through the rewrite voltage input terminal 21.

Figure 4:
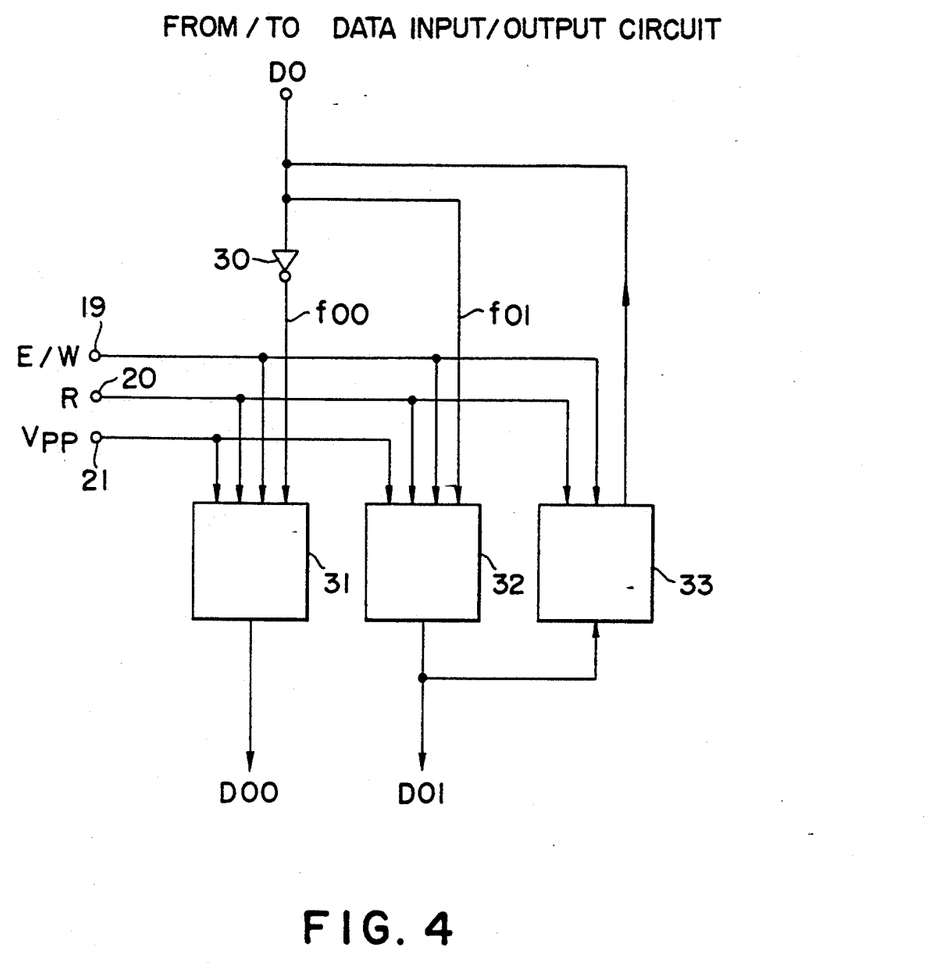
FIG. 4 is a block diagram showing a controller of the first embodiment shown in FIG. 3.

FIG. 4 shows an example of the controller 18, in which only the circuit portion corresponding to the first bit D0 of a 4-bit input/output data is shown. Therefore, three additional similar circuits are provided for the remaining three bits D1 to D3 of an input data.

When a data is written in FIG. 4, a bit data D0 inputted through the date input/output circuit 15 is inverted by an inverter 30 and then applied to a first output switch circuit 31 as a select signal f00. Further, the bit data D0 is applied to a second output switch circuit 32 without inversion as a select signal f01. Further, these output switch circuits 31 and 32 are controlled on the basis of the rewrite signal E/W, the read signal R and the rewrite voltage $V_{PP}$. The output of the first output switch circuit 31 is connected to the data erase line D00, and the output of the second output switch circuit 32 is connected to the data write line D01.

In the data write operation, the rewrite signal E/W is set to "1" to keep the output switch circuits 31 and 32 in an output state. In this state, the output voltage levels of the circuits 31 and 32 are determined on the basis of the select signals f00 and f01, respectively. In more detail, the circuit 31 or 32 outputs a rewrite voltage $V_{PP}$ when the select signal f00 or f01 is at "1" and a zero voltage 0 V when at "0". Accordingly, if an input bit data D0 is at "0", a rewrite voltage $V_{PP}$ is outputted to the data erase line D00 and a zero voltage 0 V is outputted to the data write line D01. If an input bit data D0 is at "0", the above voltage conditions are reversed.

The data rewrite line D01 is also connected to an input terminal of a read circuit 33. This read circuit 33 is also controlled in response to the rewrite signal E/W and the read signal R. In the data write operation, the read circuit 33 is set to a high impedance state in response to a "1" level rewrite signal E/W to prevent the data rewrite line D01 from being affected by the signal E/W.

In the data read operation, the read signal R is set to "1". Therefore, the first output switch circuit 31 outputs a read voltage $V_R$; the second output switch circuit 32 is kept in a high impedance state; and the read circuit 33 is set to a read state. Accordingly, a data D0 stored in a selected memory cell is outputted to the data rewrite line D01 and then read to the data input/output circuit 15 via the read circuit 33.

Table 1 below lists the relationship between input and output signal levels of the controller 18.

TABLE 1

| OPERATION | INPUT DATA Dn (n = 0~3) | D00 | D01 | D10 | D11 |
|---|---|---|---|---|---|
| E/W = 1 (REWRITE) | 0 (or 1) | $V_{PP}$ | 0 | $V_{PP}$ | 0 |
|  | 1 (or 0) | 0 | $V_{PP}$ | 0 | $V_{PP}$ |
| R = 1 (READ) | — | $V_R$ | — | $V_R$ | — |

| OPERATION | INPUT DATA Dn (n = 0~3) | D20 | D21 | D30 | D31 |
|---|---|---|---|---|---|
| E/W = 1 (REWRITE) | 0 (or 1) | $V_{PP}$ | 0 | $V_{PP}$ | 0 |
|  | 1 (or 0) | 0 | $V_{PP}$ | 0 | $V_{PP}$ |
| R = 1 (READ) | — | $V_R$ | — | $V_R$ | — |

(Unit: V)

$V_{PP}$: REWRITE VOLTAGE
$V_R$: CONTROL GATE VOLATAGE AT READ

Table 2 below shows a similar relationship for the conventional controller 10 shown in FIG. 2.

TABLE 2

| OPERATION | INPUT DATA Dn (n = 0~3) | Z | D01 | D11 | D21 | D31 |
|---|---|---|---|---|---|---|
| E = 1 (ERASE) | 0 (or 1) | $V_{PP}$ | 0 | 0 | 0 | 0 |
|  | 1 (or 0) | $V_{PP}$ | 0 | 0 | 0 | 0 |
| W = 1 (REWRITE) | 0 (or 1) | 0 | 0 | 0 | 0 | 0 |
|  | 1 (or 0) | 0 | $V_{PP}$ | $V_{PP}$ | $V_{PP}$ | $V_{PP}$ |
| R = 1 (READ) | — | | $V_R$ | — | — | — |

(Unit: V)

Comparing tables 1 and 2, in the case of the conventional semiconductor memory device, whenever a data is required to be rewritten, all the data stored in all the memory cells corresponding to an address to be rewritten are first erased, irrespective of the logical values of an input data Dn (n=0 to 3) to be written, and thereafter a logical value "1" (or "0" in negative logic) is written in all the memory cells to be written according to the logical values of an input data Dn (n=0 to 3).

In contrast with this, in the case of the present invention, whenever a data is required to be rewritten (E/W=1), an erase operation is executed to the memory cells to which a logical value "0" ("1" in negative logic) is to be written, according to the logical values of an input data Dn (n=0 to 3), by applying the rewrite voltage $V_{pp}$ to the control gates thereof and the zero voltage 0 V to the drains thereof. Further, a write operation is executed to the memory cells to which a logical value "1" ("0" in negative logic) is to be written, by applying a zero voltage 0 V to the control gates thereof and the rewrite voltage $V_{pp}$ to the drains thereof. In other words, any one of data erase operation and data write operation is selected for each memory cell according to logical values of an input data to be written, and additionally the selected erase and write operations are executed simultaneously to all the memory cells.

That is, since a data can be rewritten by a single operation, it is possible to halve the time required to rewrite data, as compared with the prior-art method in which the data erase operation and the data write operation are executed separately by two divided operations. In addition, since the processing task required to rewrite data can also be halved and simultaneously the frequency of high voltage applications can also be reduced, it is possible to increase the lifetime of each memory cell.

Figure 5:
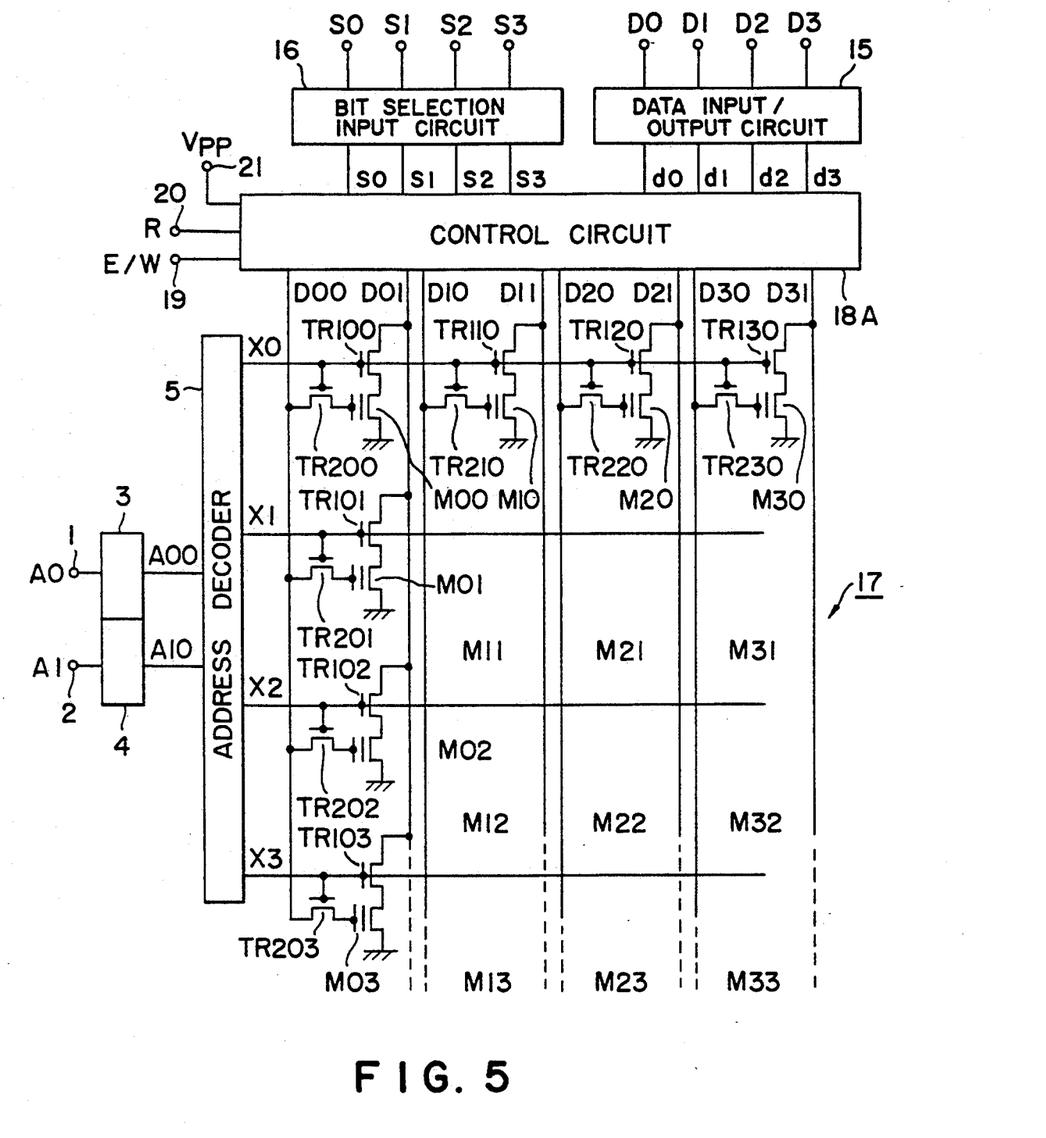
FIG. 5 is a circuit diagram showing a second embodiment of the present invention.

FIG. 5 shows another embodiment of the present invention, which is basically the same in configuration as the previous embodiment, excepting that the function of the control circuit differs from that in the first embodiment and that a bit select input circuit 16 is additionally provided. Therefore, the same references have been retained for similar elements which have the same functions, without repeating any detailed description thereof.

The bit select signal input circuit 16 holds bit select signals S1, S2, S3 and S4 inputted through bit select signal input terminals S0, S1, S2 and S3 as bit selecting information to designate some bits required to be rewritten and further outputs these bit select signals to the controller 18. This bit select signal input circuit 16 is composed of buffer and latch circuits in the same way as the data input/output circuit 15.

The controller 18 executes a data rewrite operation whenever a "1" level rewrite signal E/W is applied to the control terminal 19, and a data read operation whenever a "1" level read signal R is applied to the control terminal 20. Here, it should be noted that the memory cells belonging to the same address (e.g. M00, M10, M20 and M30) are connected to four different data erase lines D00 to D30 and four different data write lines D01 to D31, respectively. In the data rewrite operation, the controller 18 selectively applies a rewrite voltage $V_{pp}$ or a zero voltage 0 V to each data erase line and each data write line connected to each memory cell. Therefore, any one of the data erase and write operations can be selected for each memory cell. Further, in the data rewrite operation, a rewrite voltage $V_{pp}$ is supplied to the controller 18 through the rewrite voltage input terminal 21.

Figure 6:
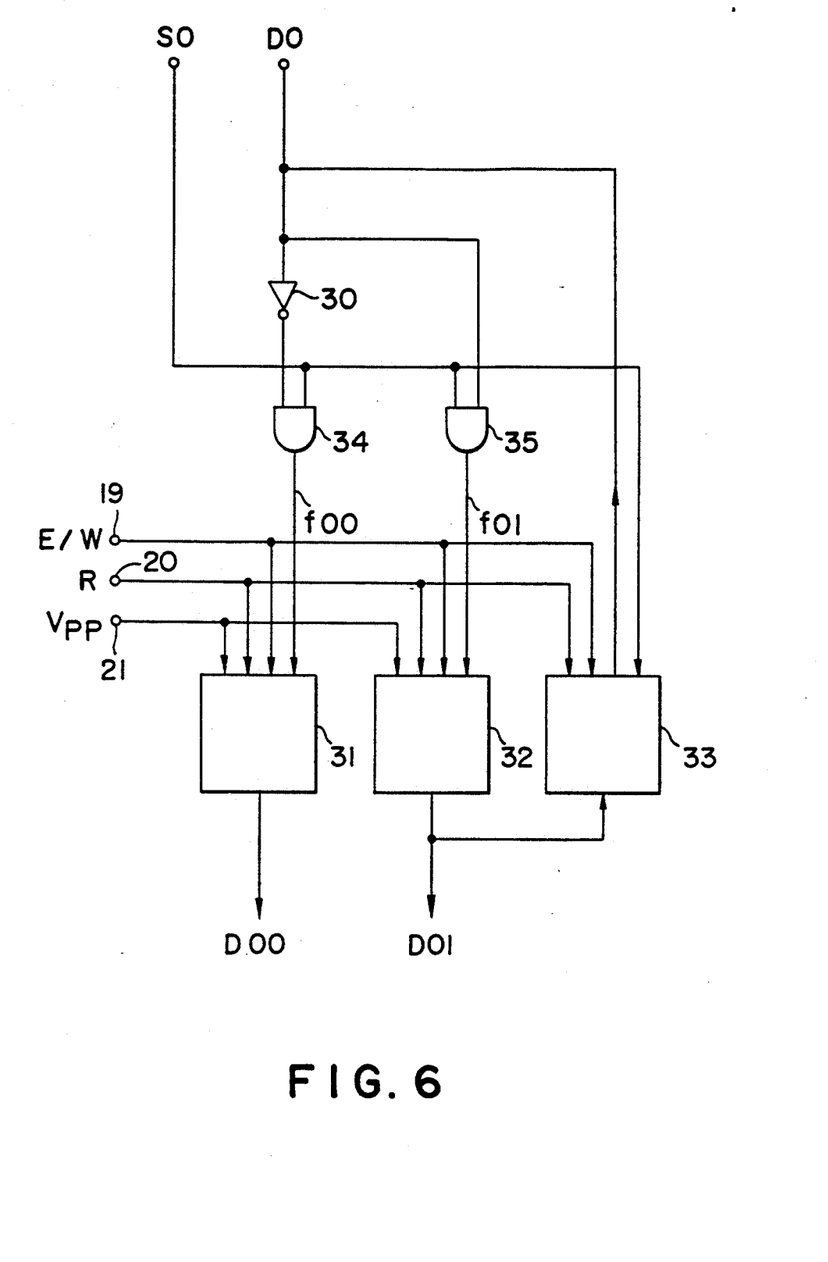
FIG. 6 is a block diagram showing a controller of the second embodiment shown in FIG. 5.

FIG. 6 shows an example of the controller 18, in which only the circuit portion corresponding to the first bit D0 of a 4-bit input/output data is shown. Therefore, three additional similar circuits are provided for the remaining three bits D1 to D3 of an input data. In the drawing, both the first output switch circuit 31 and the second output switch circuit 32 are controlled on the basis of the rewrite signal E/W, the read signal R and the rewrite voltage $V_{pp}$. The output of the first output switch circuit 31 is connected to the data erase line D00, and the output of the second output switch circuit 32 is connected to the data write line D01. In the data write operation, the rewrite signal E/W is set to "1", so that the output switch circuits 31 and 32 are kept in an output state.

In this state, if the select signal s0 inputted through the bit select signal input terminal S0 is at "0" level, the output signal f00 of an AND gate 34 is at "0", irrespective of the level (i.e. "1" or "0") of the data D0 inputted via the data input/output circuit 15 and the inverter 30, so that a "0" level signal is applied to the first output switch circuit 31 from the AND gate 34. On the other hand, since the output signal f01 of an AND gate 35 is at "0" in the same way, a "0" level signal is applied to the second output switch circuit 32. Accordingly, since a "0" level output signal is applied to the data erase line D00 and the data write line D01, a data stored in the memory cell M00 corresponding to the bit select signal input terminal S0 will not be rewritten. However, if the select signal s0 inputted through the bit select signal input terminal S0 is at "1", the output signal f00 or f01 of the AND gate 34 or 35 is at "1" or "0", respectively according to the level (i.e. "1" or "0") of the bit data d0 inputted via the data input/output circuit 15. That is, if the data d0 is at "1", since the logical value of the data d0 is inverted into "0" via the inverter 30, the output signal f00 of the AND gate 34 is at "0" level, this "0" level signal is applied to the first output switch circuit 31. On the other hand, since the output signal f01 of the AND gate 35 is at "1" level, this "1" level signal is applied to the second output switch circuit 32. Accordingly, a zero voltage 0 V is applied from the first output switch circuit 31 to the data erase line D00 and a rewrite voltage $V_{pp}$ is applied from the second output switch circuit 32 to the data write line D01, respectively. In contrast, if the bit data d0 is at "0", since the logical level of this data d0 is inverted to "1" by an inverter 30, the output signal f00 of the AND gate 34 is at "1", this "1" level signal is applied to the first output switch circuit 31. On the other hand, since the output signal f01 of the AND gate 35 is at "0" level, this "0" level signal is applied to the second output switch circuit 32. Accordingly, a rewrite voltage $V_{pp}$ is applied from the first output switch circuit 31 to the data erase line D00 and a zero voltage 0 V is applied from the second output switch circuit 32 to the data write line D01, respectively.

Here, the above-mentioned data rewrite line D01 is also connected to an input terminal of a read circuit 33. This read circuit 33 is also controlled in response to the rewrite signal E/W and the read signal R. In the data write operation, the read circuit 33 is set to a high impedance state in response to a "1" level rewrite signal E/W, without exerting any influence upon the data rewrite line D01.

In the data read operation, the read signal R is set to "1", so that the first output switch circuit 31 outputs a read voltage $V_R$; the second output switch circuit 37 is kept in a high impedance state; and the read circuit 33 is set to a read state, when the bit select signal s0 inputted through the bit select signal input terminal S0 under the above-mentioned conditions is at "1". Accordingly, a data D0 stored in a selected memory cell (e.g. M00) is outputted to the data rewrite line D01, and then read to the data input/output circuit 15 via the read circuit 33.

Table 3 below lists the relationship between input and output signal levels of the controller 18.

TABLE 3

| OPERATION | INPUT DATA Dn (n = 0~3) | BIT SELECT SIG Sn | D00 (n = 0~3) | D01 (n = 0~3) |
|---|---|---|---|---|
| E/W = 1 (REWRITE) | 0 | 0 | 0 | 0 |
|  | 1 | 0 | 0 | 0 |
|  | 0 (or 1) | 1 | $V_{PP}$ | 0 |
|  | 1 (or 0) | 1 | 0 | $V_{PP}$ |
| R = 1 (READ) | — | 0 | 0 | — |
|  | — | 1 | $V_R$ | — |

(Unit: V)

In comparison between tables 1 and 3, in the case of the second embodiment, whenever a data is required to be rewritten (i.e. E/W=1), a data write or erase operation is executed to only the memory cells corresponding to "1" level bit select signals sn (n=0 to 3) outputted by the bit select input circuit 16, according to the logical value (i.e. "1" or "0") of an input data dn (n=0 to 3) given through the data input/output circuit 15. On the other hand, no data write or erase operation is executed to the memory cells corresponding to "0" level bit select signals sn (n=0 to 3) outputted by the bit select input circuit 16, irrespective of the logical values (i.e. "1" or "0") of an input data dn (n=0 to 3) given through the data input/output circuit 15.

In the same way, whenever a data is required to be read, a data read operation is executed to only the memory cells corresponding to "1" level bit select signals sn (n=0 to 3), and no data read operation is executed to the memory cells corresponding to "0" level bit select signals.

As described above, in the method of rewriting and reading data by the semiconductor memory device according to the present invention, since data rewrite, erase or read operation can be executed to only memory cells belonging to an address and required to be rewritten or read, it is unnecessary to execute the rewrite, erase or read operation to all the memory cells belonging to an address, being different from the conventional semiconductor memory device by which data writing operation is executed to all the memory cells after all the memory cells have been once erased.

What is claimed is:

1. A semiconductor memory device, comprising:
   (a) a memory cell array formed by arranging a plurality of electrically rewritable non-volatile memory cells in matrix form, each memory cell including a memory MOS transistor with a floating gate, an erase transistor having a first terminal connected to a control gate of said memory MOS transistor so as to be selectively turned on, and a write transistor having a first terminal connected in series with said memory MOS transistor so as to be selectively turned on;
   (b) address lines connected in common to gates of said erase transistors belonging to the same address and connected to gates of said write transistors of said memory cells belonging to the same address;
   (c) erase lines provided for respective bits, said erase lines being connected to second terminals of said erase transistors belonging to the same bit;
   (d) write lines provided for respective bits, said write lines being connected to second terminals of said write transistors belonging to the same bit; and
   (e) control means for applying a high rewriting voltage to either one of said erase lines and said write lines belonging to a bit according to a bit logical value of an input data, in case of a rewrite operation for a bit, whereby an erase operation and a write operation can be performed simultaneously.

2. The semiconductor memory device of claim 1, wherein said control means comprises for each bit a first switch circuit for applying a rewriting voltage to either one of said write lines and said erase lines and a second switch circuit for applying a zero voltage to the other thereof, according to a bit logical value of input data and in response to a rewrite signal.

3. The semiconductor memory device of claim 2, which further comprises a data input/output circuit connected to said control means, for providing a given input data to a respective bit position of said control means reliably.

4. A semiconductor memory device, comprising:
   (a) A memory cell array formed by arranging a plurality of electrically rewritable non-volatile memory cells in matrix form, each memory cell including a memory MOS transistor with a floating gate, an erase transistor whose first terminal is connected to a control gate of said memory transistor so as to be selectively turned on, and a write transistor having a first terminal connected in series with said memory MOS transistor so as to be selectively turned on;

(b) address lines connected in common to gates of said erase transistors belonging to the same address and connected to gates of said write transistors of said memory cells belonging to the same address;
(c) erase lines provided for respective bits, said erase lines being connected to second terminals of said erase transistors belonging to the same bit;
(d) write lines provided for respective bits, said write lines being connected to second terminals of said write transistors belonging to the same bit;
(e) control means for applying a predetermined high voltage to either one of said erase lines and said write lines belonging to a bit according to a bit logical value of each selected bit of an input data, in the case of a read or a rewrite operation for a bit, whereby an erase operation and a write operation can be performed simultaneously.

5. The semiconductor memory device according to claim 4, wherein said control means has means for applying a high rewriting voltage for data rewrite operation and means for applying a relatively high reading voltage for data read operation.

6. The semiconductor memory device of claim 4, wherein said control means comprises for each bit a first switch circuit for applying a rewriting voltage to either one of said write lines and said erase lines and a second switch circuit for applying a zero voltage to the other thereof, according to respective data value of a selected bit and in response to a rewrite signal.

7. The semiconductor memory device of claim 5, which further comprises a bit select input circuit connected to said control means, for providing a given input data to respective bit position of said control means reliably.

* * * * *